(12) United States Patent
Decker et al.

(10) Patent No.: US 10,211,550 B2
(45) Date of Patent: Feb. 19, 2019

(54) ARRANGEMENT WITH CIRCUIT CARRIER FOR AN ELECTRONIC DEVICE

(71) Applicant: CONTINENTAL AUTOMOTIVE GMBH, Hannover (DE)

(72) Inventors: Michael Decker, Regensburg (DE); Thomas Riepl, Bad Abbach (DE); Holger Schlotter, Regensburg (DE)

(73) Assignee: Continental Automotive GmbH, Munich (DE)

( * ) Notice: Subject to any disclaimer, the term of this patent is extended or adjusted under 35 U.S.C. 154(b) by 141 days.

(21) Appl. No.: 15/458,582

(22) Filed: Mar. 14, 2017

(65) Prior Publication Data
US 2017/0187131 A1    Jun. 29, 2017

Related U.S. Application Data

(63) Continuation of application No. PCT/EP2015/069600, filed on Aug. 27, 2015.

(30) Foreign Application Priority Data

Sep. 23, 2014    (DE) .................. 10 2014 219 126

(51) Int. Cl.
*H01R 12/58*    (2011.01)
*H05K 1/11*    (2006.01)

(52) U.S. Cl.
CPC ............. *H01R 12/58* (2013.01); *H05K 1/115* (2013.01); *H05K 2201/0116* (2013.01); *H05K 2201/10303* (2013.01)

(58) Field of Classification Search
CPC ........ H01R 12/52; H01R 12/714; H01R 12/57; H01R 12/585; H01R 4/2433;
(Continued)

(56) References Cited

U.S. PATENT DOCUMENTS 7,168,958 B1 *    1/2007   Brodsky ............. H05K 7/1061
                                                   439/66
8,058,669 B2 *   11/2011   Chen ................... H01L 25/0753
                                                   257/59
(Continued)

FOREIGN PATENT DOCUMENTS

DE    102005030551 A1    1/2007
EP         2187719 A1    5/2010
WO     2006136139 A1   12/2006

OTHER PUBLICATIONS

International Search Report and Written Opinion dated Jan. 15, 2016, from corresponding International Patent Application No. PCT/EP2015/06960.

*Primary Examiner* — Truc Nguyen

(57)    ABSTRACT

An arrangement for an electronic device is disclosed. A plurality of electrically conductive pins is positioned in respective vias of the circuit carrier, the pins extend from a first face of the circuit carrier to a contact end in order to electrically contact one or more components. The arrangement is equipped with an electrically insulating layer on a circuit carrier face, which is the first or a second face, in the region of the pin, the insulating layer having a prefabricated element which is positioned on the face of the circuit carrier. A portion of each pin, the portion being arranged adjacently to the respective via on the face, is surrounded by the material of the insulating layer in a continuously lateral manner.

23 Claims, 12 Drawing Sheets

(58) Field of Classification Search
CPC .............. H01R 12/716; H01R 13/2435; H01R 13/6658; H01R 2107/00; H01R 24/64; H01R 12/707; H01R 12/71; H01R 12/712; H01R 12/79
See application file for complete search history.

(56) References Cited

U.S. PATENT DOCUMENTS

| | | | |
|---|---|---|---|
| 8,246,396 B2* | 8/2012 | Lechner | H01R 12/58 439/78 |
| 9,536,816 B2* | 1/2017 | Kessler | H01L 23/3735 |
| 9,578,749 B2* | 2/2017 | Cho | H05K 1/187 |
| 9,667,016 B2* | 5/2017 | Tamai | H01R 13/6467 |
| 9,698,120 B2* | 7/2017 | Shen | H01L 24/96 |
| 2012/0208381 A1* | 8/2012 | Garcia | H01R 13/2421 439/64 |
| 2013/0090025 A1* | 4/2013 | Trout | H01R 4/028 439/884 |
| 2014/0113504 A1* | 4/2014 | Moser | H01R 13/03 439/751 |
| 2014/0308850 A1* | 10/2014 | Song | H01R 4/2404 439/620.15 |

* cited by examiner

ARRANGEMENT WITH CIRCUIT CARRIER FOR AN ELECTRONIC DEVICE

CROSS REFERENCE TO RELATED APPLICATIONS

This U.S. patent application claims the benefit of PCT patent application No. PCT/EP2015/069600, filed Aug. 27, 2015, which claims the benefit of German patent application No. 10 2014 219 126.2, filed Sep. 23, 2014, all of which are hereby incorporated by reference.

TECHNICAL FIELD

The invention relates to an arrangement for an electronic device, in particular for a control unit for a motor vehicle.

BACKGROUND

In the case of arrangements having a circuit carrier and electrically conductive pins, so-called "whisker growth" can occur at contact sites between the circuit carrier and the electrically conductive pins, wherein a metallic crystal structure (so-called "whisker" or "hair crystal") is formed. The whiskers are, in particular, pin-shaped monocrystals. By way of example, tin and zinc are particularly prone to whisker growth of this type. The reasons why whiskers are produced are not completely known. It is, however, assumed that the process is triggered by thermo-mechanical stresses in the surface material of the pins as a result of mechanical deformation, electro-physical mechanisms between the substrate of the circuit carrier and the surface material of the pins, and/or intrinsic stresses in the metal of the pins as a result of intensive contact or diffusion stresses with the substrate material of the circuit carrier. Whiskers can grow at a rate of a few micrometers per year up to a millimeter per year and have a typical diameter of a few micrometers.

Whiskers can produce undesired electrical connections—by way of example, between high ohmically separated potentials of an electronic circuit that is arranged on the circuit carrier. This can cause the falsification of signals. Moreover, it is possible, in the case of a high electrical potential difference or as a result of high currents at a potential when closing a field contact, for an arc to occur temporarily as a result of the vaporization of the whiskers. This can cause electronic components on the circuit carrier to become damaged as a result of a short-term overcurrent or a short-term overvoltage. Moreover, whiskers can break off as a result of a mechanical shock and in other circuit regions of the circuit carrier remote from their growth region said whiskers can lead to negative influences on the circuit carrier, by way of example, short circuits.

In order to avoid or reduce the growth of whiskers, it is known to provide surface alloys on pins using alloy additives, such as, for example, silver or gold. However, this variant is very cost intensive owing to the high material value of these metals.

SUMMARY

It is therefore the object of the invention to counteract the negative influences of whisker growth in a simple and/or cost-effective manner on a circuit carrier having pins provided thereon.

In accordance with one aspect, an arrangement for an electronic device is provided that comprises a circuit carrier and a multiplicity of electrically conductive pins. In accordance with a further aspect, an electronic device having the arrangement is provided. The electronic device is, by way of example, a control unit. The control unit can be a control unit for a motor vehicle, for example an engine control unit.

The circuit carrier is plate-shaped having a first face and a second face. The first face and the second face are in particular mutually opposite lying main surfaces of the circuit carrier, in other words a first main surface and a second main surface. The first face or the first and second faces is/are populated, in the case of the electronic device, with electronic components. It is preferred that the circuit carrier is a circuit board having circuit tracks and components provided thereon.

The circuit carrier comprises a multiplicity of vias that extend in particular from the first to the second face. The vias are, by way of example, through-going holes that are preferably clad with a metal.

The electrically conductive pins are positioned in the vias of the circuit carrier. In particular, one of the pins is arranged in each via, in other words in particular precisely one of the pins. In other words, the pins have in each case a contact end for making contact with a component and a connection end that lies opposite the contact end. The connection ends of the pins are received into the vias.

The pins extend from the first face as far as the contact ends so as to make electrical contact with one or multiple components. In other words, the pins extend from the connections that are adjacent to the circuit carrier in the direction of the first face away from the contact ends. Expressed differently, sections of the pins that protrude from the first face of the circuit carrier are provided so as to make contact with further components. It is preferred that the pins are inserted from the first face into the vias of the circuit carrier.

An electrically insulating layer is arranged in the region of the pins on a face of the circuit carrier that is the first face or the second face. It is preferred that the electrically insulating layer is arranged on the first face from which the pins are inserted into the vias.

It is also feasible that a first electrically insulating layer is arranged on the first face and a second electrically insulating layer is arranged on the second face. In this case, the first and second electrically insulating layers, preferably both, are preferably formed in accordance with at least one of the embodiments described hereinunder. However, for the sake of simplification, only one electrical insulating layer is mentioned in the following description.

The electrically insulating layer comprises a prefabricated body or is embodied from a prefabricated body that is positioned on the one face of the circuit carrier. The prefabricated body lies preferably on the circuit carrier and, by way of example, the body lies on the circuit tracks or on a solder resist that is covering the circuit tracks. In the case of one embodiment, said prefabricated body is fastened to the circuit carrier by means of an adhesive layer or an adhesive film.

The above term "prefabricated body" is to be understood in particular in such a manner that the body, when positioned on the one face of the circuit carrier, already comprises a fixed structure and shape. In other words, the body is already prefabricated in its structure and shape prior to it being positioned on the circuit carrier, which for example is not the case when using a casting material. The prefabricated body is placed and/or pressed onto the circuit carrier during the production of the arrangement, in particular without changing the shape of said prefabricated body.

A section, which is associated with the respective pin and extends in its longitudinal direction and which lies on the one face adjacent to the respective via in which the respective pin is positioned, is continuously surrounded by the material of the insulating layer. In other words, material of the insulating layer lies around a section of each pin that commences at the via and encompasses the entire extent of the pin. In other words, each pin has a section that is adjacent to one face—preferably the first face—of the circuit carrier. The section extends in a longitudinal direction away from the circuit carrier and is surrounded by a side wall, which laterally completely extends around the pin and is formed by the insulating layer, in such a manner that the sections of the individual pins are separated from one another by means of the side walls.

By virtue of the arrangement, in accordance with embodiments of the invention, it is achieved that whisker growth in the contact region between the pins and vias is delimited locally and thus the negative influences of whiskers are to a great extent eliminated. In particular, by virtue of separating the individual pins by means of the side walls, the growth of whiskers in each growth path is blocked by means of the electrically insulating layer for an adjacent pin. In this manner, the risk of undesired electrical connections as a result of whiskers is particularly low.

In a preferred embodiment, the electrically insulating layer is provided only locally in the region of the pins and covers in particular over 50% or less, preferably over 20% or less of the first or second face of the circuit carrier in the plan view to the respective face.

In the case of one embodiment, the pins comprise in each case a coating that comprises tin and/or zinc and in particular is embodied from tin, zinc or an alloy that comprises tin and/or zinc. These materials are greatly susceptible to whisker growth. The pins are preferably embodied overall from one or multiple metal materials. In one embodiment, said pins comprise a core that is encompassed by the coating and is embodied in particular from an alloy that comprises copper and tin and whose composition differs in an expedient manner from the composition of the coating.

Pins having coatings of this type have advantageous mechanical and/or electrical characteristics. However, the coating is also encumbered with a particularly high risk of whisker growth but this growth is advantageously obstructed and spatially delimited by means of the present arrangement. The risk of electrical malfunctions as a result of whiskers from the adjacent pins is therefore particularly low.

In a further embodiment, the pins are pressed into the vias, in other words, the pins are held in the vias by means of a so-called press-fit. In this case, in a further development at least one pin in the region of the via—in other words, a part or piece of the pin arranged between the first and second face and/or adjacent to the first or second face—is not covered by the coating or the coating in this region is damaged. By way of example, the coating can be abraded. However, as an alternative or in addition thereto, there is also the possibility that the pins are held by means of a solder connection in the vias.

Damage to the coating can be particularly susceptible to whisker growth. Damage of this type occurs in the vicinity of or within the circuit carrier in particular as the pins are pressed therein. A region of the pins that is directly adjacent to the circuit carrier is therefore particularly critical as a starting point for the whiskers. However, the electrically insulating layer is advantageously arranged at this site and separates the individual pins from one another and delimits the space available for the whisker growth.

In one embodiment, the prefabricated body is formed from a foamed or an elastic synthetic material. Examples of foamed synthetic materials uses are foamed polystyrene, polyester, polyether and polyurethane, for example PUR-W polyurethane. Examples of elastic synthetic materials are polyurethane elastomers such as TPU (thermoplastic polyurethane) elastomers, and synthetic rubbers such as ethylene propylene diene rubber (EPDM) and nitrile rubber (NBR). Moreover, it is possible to use a roller band material that can be arranged in a simple manner on the circuit carrier.

In a further embodiment of the arrangement, the prefabricated body comprises a porous material or is embodied from a porous material. The porous material is in particular the foamed synthetic material. As a consequence, an arrangement in accordance with an embodiment of the invention is achieved in a particularly simple manner. In a further development of this embodiment, the pins are preferably pushed through the porous material with their section that is adjacent to the respective via. As an alternative or in addition thereto, the sections of the pins can, however, also be arranged in prefabricated through-going openings in the porous material.

In a further embodiment, the prefabricated body is embodied from a uniform material, in particular from a synthetic material. Examples of synthetic materials are polybutylene terephthalate (PBT), polyamide (PA), polyacrylate, polyphenylene sulphide (PPS), polypropylene (PP), polybutene (PB), polymethylpentene (PMP), polystyrene (PS), acrylonitrile butadiene styrene (ABS) and fluoropolymers such as polytetrafluoroethylene (PTFE) and polyvinyl floride (PVF).

In a further embodiment, the prefabricated body comprises multiple through-going openings, wherein at least one pin, and in particular an individual pin with its section that is adjacent to the via, is arranged in each via.

In a preferred variant, the pins are separated by means of the through-going openings themselves. In so doing, at least a part of the through-going openings surrounds, in each case an individual pin, continuously in the section of the pin adjacent to the via. Nonetheless, at least one part of the through-going openings can be connected in each case by way of one or multiple lateral through-going passages to other through-going openings. The pin is continuously surrounded in this case preferably by means of an additional material in addition to the material of the prefabricated body,—by way of example, in the manner described in more detail hereinunder. The lateral through-going passages extend in particular in a perpendicular manner, in an inclined manner, curved or angled with respect to the longitudinal direction of the sections of the pins that are arranged in the through-going openings. In an expedient manner, adjacent through-going openings can be connected to one another by means of lateral through-going passages.

In a further embodiment, the through-going openings are filled with a casting material that also penetrates in particular the above described through-going passages. Examples of casting materials are silicone, polyurethane (PUR), epoxy resin (EP) and polyacrylate.

In a further embodiment, the arrangement comprises a centering strip in which the pins are guided. The centering strip is preferably adjacent to the electrically insulating layer. In other words, the prefabricated body is preferably arranged between the first centering strip and the circuit carrier—in particular the first face of the circuit carrier from which the pins are inserted into the through-going openings. The centering strip renders it possible, when connecting the pins to the circuit carrier, to align the pins with respect to the vias in a simple and precise manner. The centering strip, in a further development, is formed in an integral—in other words, one piece—manner with the prefabricated body. The prefabricated body is pressed advantageously by means of the centering strip in particular onto the circuit carrier.

In a further embodiment, a resilient means, in particular at least one resilient element, is provided that pushes the prefabricated body against the one face of the circuit carrier. By way of example, the resilient element is supported between the centering strip and the prefabricated body so as to press the prefabricated body against the circuit carrier. In an advantageous manner, the resilient means is formed on the above described centering strip, for example in the form of multiple resilient clips that extend from the centering strip in an inclined or bent manner with respect to the prefabricated body. The resilient clips can be an integral component of the centering strip.

The prefabricated body is held in a further embodiment by means of one or multiple latching lugs and/or rasping ribs and/or an adhesive connection on the circuit carrier and/or the centering strip.

If the prefabricated body is pressed onto the circuit carrier by means of the centering strip or the resilient elements, or is held by means of the latching lugs, rasping ribs or the adhesive connection on the circuit carrier, then the risk of whiskers spreading laterally between the circuit carrier and the prefabricated body is particularly low.

In accordance with a further aspect, the invention relates to a method for producing the arrangement in accordance with one or more of the above described embodiments and further developments.

In the case of the method, the electrically conductive pins are positioned in respective vias of the circuit carrier, and an electrically insulating layer is formed in the region of the pins on the one face of the circuit carrier, wherein the procedure of forming the electrically insulating layer includes the positioning of a prefabricated body on the one face of the circuit carrier. The procedure of forming the electrically insulating layer is designed in such a manner that one section of each pin, which lies on the one face adjacent to the respective via in which the respective pin is positioned, is continuously surrounded by the material of the electrically insulating layer.

Depending upon the embodiment of the method in accordance with the invention, it is possible initially to perform the step of positioning the pins in the vias and subsequently to perform the step of producing the electrically insulating layer, or conversely by reversing the steps.

BRIEF DESCRIPTION OF THE DRAWINGS

Exemplary embodiments of the invention are described in detail hereinunder with reference to the attached schematic figures. In the drawings.

DETAILED DESCRIPTION

Figure 1:
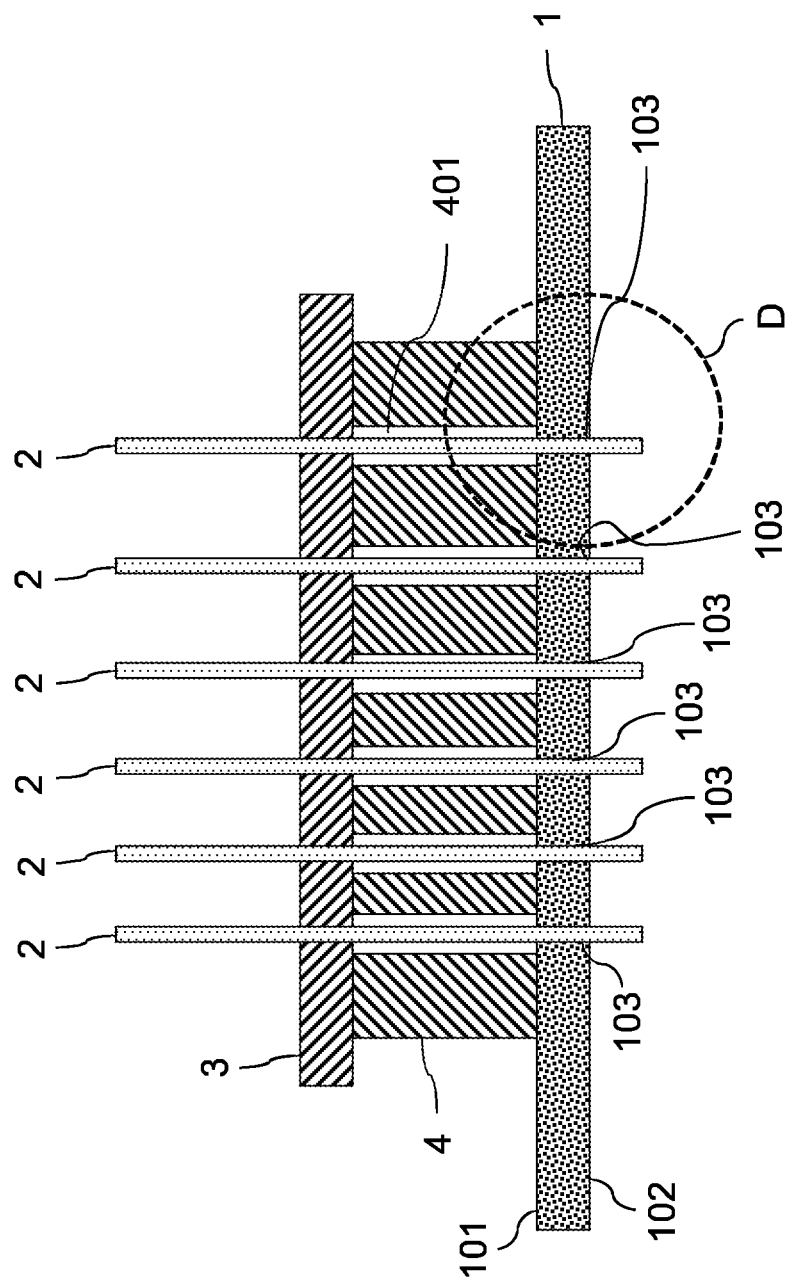
FIG. 1 illustrates a sectional view of a first embodiment of an arrangement in accordance with the invention.

Like, similar or like functioning elements are provided in the figures with like reference numerals. In some figures, individual reference numerals can be omitted so as to improve clarity. The figures and the proportions of the elements illustrated in the figures with respect to one another are not to be regarded as being to scale. On the contrary, individual elements can be illustrated in an exaggerated enlarged manner so as to improve the illustration and/or make it easier to understand.

A description is provided hereinunder of embodiments of an arrangement in accordance with the invention having a circuit carrier in the form of a circuit board, which in a preferred variant is installed in a control unit of a motor vehicle, such as for example in an engine control unit.

FIG. 1 illustrates a side view through a part of the arrangement in accordance with a first exemplary embodiment. The circuit board is identified by the reference numeral 1 and comprises a first main surface, the upper face 101, and a second main surface, the lower face 102. Multiple vias 103 are formed in the circuit board 1 and said vias completely pass through the circuit board in the direction from the upper face 101 to the lower face 102. A metal sleeve is formed in these vias and said metal sleeve is embodied, for example, from copper or a copper alloy. The circuit board 1 comprises a multiplicity of circuit tracks and electronic components that are not illustrated in further detail in the figures. At least one part of the circuit tracks is arranged on the upper face 101 of the circuit board 1. At least one part of the electronic components is arranged on or above the upper face 101.

Contact is made with the circuit board 1 by way of the upper face 101 by means of corresponding pins 2 that are inserted into the vias 103. By way of example, the pins 2 are a component of a plug connector or one of the electronic components. Each pin extends from one contact end, which is arranged, by way of example, in a housing of the component or plug connector (not illustrated in the figures), to a connection end that is received in the respective via 103. The connection end that is received in a via 103 includes also designs wherein—as illustrated in FIG. 1—a short end piece of the connection end of the pin 2 protrudes beyond the circuit board 1 on the lower face 102 of the circuit board 1 that is remote from the contact end.

The individual pins 2 comprise a core, which is embodied from an alloy comprising copper and tin, and a soft surface coating in the form of a tin plating with which the core is coated. The cross-section of the pins is rectangular in the case of the present exemplary embodiment; however the invention is not limited to rectangular cross-sections.

In the present exemplary embodiment, the pins 2 are pressed into the individual vias 103 by way of the upper face 101 of the circuit board 1 by means of a so-called press-fit. As an alternative or in addition thereto, the pins 2 can also be soldered in the vias 103.

The pins 2 are held in a centering strip 3 by means of which it is easier to align and insert the pins in the vias 103. The centering strip 3 can also be referred to as a threading strip. The centering strip 3 comprises an electrically insulating material and can be embodied, for example, from a synthetic material or Teflon (in particular as a Teflon band or Teflon plate). The lateral dimensions of the pins 2—for example, the side lengths of the outer contour of the rectangular cross-sectional area or the diameter of pins 2 that have a circular cross section—have values in the range of approximately 0.4 mm to approximately 2.5 mm, wherein the limits are included. The spacing between the centering strip 3 and the upper face 101 of the circuit carrier (circuit board 1) amounts by way of example to between 200 μm and 1 mm, wherein the limits are included. The illustration in FIG. 1 and also the further figures is not true to scale and in particular the spacing between the centering strip 3 and the circuit board 1 is illustrated in an enlarged manner.

By way of example, a plug-in strip (not illustrated in the figures) is provided at the contact ends of the pins 2 in order to fasten the pins and thus the circuit board 1 to external components, a wiring harness or the like. Depending upon the embodiment, the pins 2 extend in a manner angled once, more than once or in a straight line from the centering strip 3 to the plug-in strip. An electrically insulating layer in the form of a prefabricated body 4 comprising a synthetic material is located between the centering strip 3 and the upper face 101 of the circuit board 1. The prefabricated body 4 is adjacent at the opposite lying faces to the centering strip 3 and the circuit board 1.

As is already mentioned further above, the term "prefabricated body" is to be understand to mean a body having a predetermined structure and dimension that can be positioned as an independent unit on the circuit board 1. The prefabricated body 4 thus differs from material that does not yet have a fixed shape and structure during the positioning procedure on the circuit board 1, which is the case, for example, when using casting material or solder resist.

Through-going openings 401 are provided in the prefabricated body 4 and said through-going openings extend in a vertical direction through the prefabricated body. The through-going openings 401 can also be described as cut-outs. The vertical direction is the direction of the surface normal to the upper face 101. For the sake of clarity only one of the through-going openings is provided with the reference numeral 401.

A pin 2 extends in each case through the through-going openings 401 and the size of the through-going openings is selected such that a free space is formed between the inner surface of the through-going opening 401 and the outer surface of the pin 2 that is arranged therein. In other words, the pins 2 are spaced laterally apart from the prefabricated body 4, in particular on all sides. The through-going openings 401 surround each individual pin 2 completely and ensure in this manner that whiskers are restricted locally in the individual through-going openings 401. The prefabricated body 4 consequently prevents whisker growth between adjacent pins 2 and also the associated negative influences on the electrical characteristics of the arrangement.

In other words, a side wall is formed by means of the prefabricated body 4 around a section of each pin 2 that is adjacent to the circuit board 1, said side wall extending laterally completely around the section and defining the respective through-going opening 401. The whisker growth is restricted laterally to the region that is surrounded by the respective side wall and this region can therefore also be referred to as a whisker cage. A longitudinal direction of the sections of pins 2 that are adjacent to the circuit board 1 is in each case parallel to the surface normal of the upper face 101.

Figure 2:
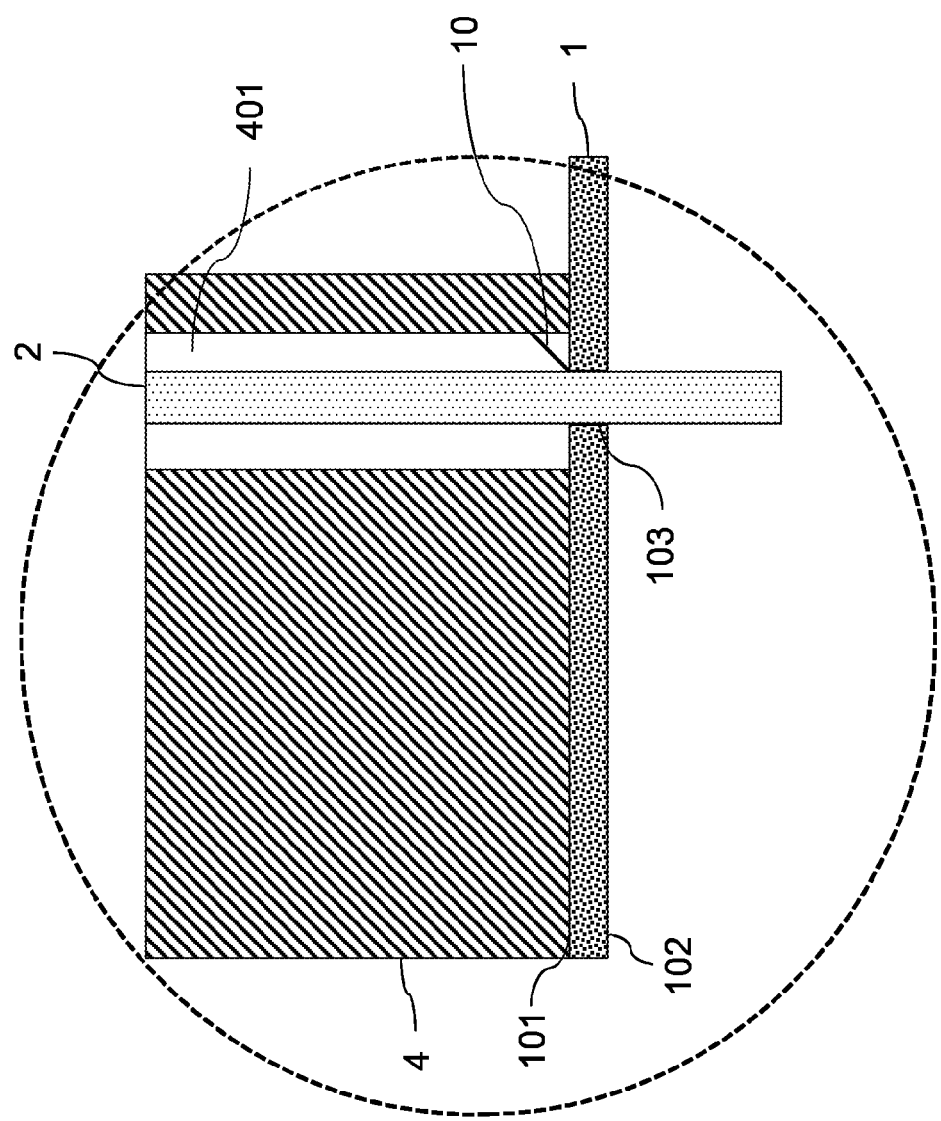
FIG. 2 illustrates in detail an area of the arrangement in FIG. 1 appearing in area D thereof.

FIG. 2 illustrates a detailed view of the area D in FIG. 1 in the region of one of the vias 103. A whisker crystal 10 is indicated in FIG. 2. This develops by virtue of the fact that as the pins 2 are pressed into the vias 103, mechanical stresses occur that lead to a local zone where the surface coating of the pin has been abraded off. This zone is susceptible as the starting point for the whisker growth. The illustrated whisker crystal 10 is restricted locally in the enclosed region of the through-going opening 401 by means of the prefabricated body 4 and cannot cause any further damage since this local region does not comprise on the circuit board 1 any further components or pins 2 whose function could be influenced.

The prefabricated body 4 can be produced in different ways or can be embodied from different materials. It is preferred that the body 4 is formed from a synthetic material as an injection molded body and in particular as an extruded injection molded body. The shaping of the through-going opening 401 can be selected to be different.

Figure 3:
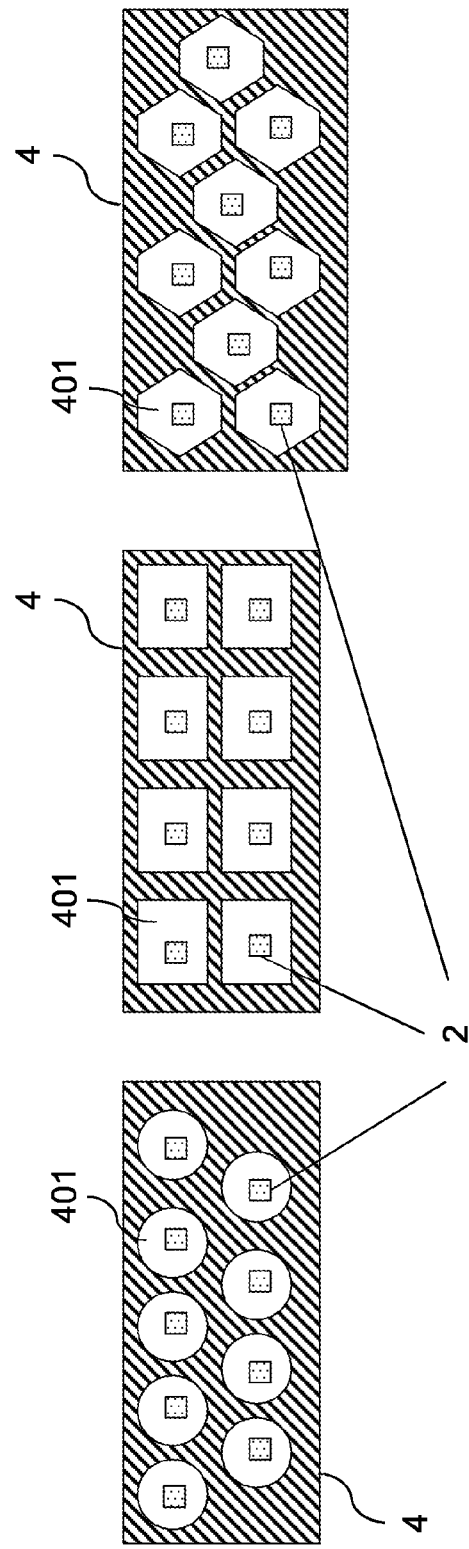
FIG. 3 is a plan view that illustrates three different variants of through-going openings having pins arranged therein in an arrangement in accordance with the invention.

FIG. 3 illustrates in a plan view of the prefabricated body 4 along the surface normal of the upper face 101 different exemplary embodiments of through-going openings 401, wherein in order to improve the clarity in turn only one of the through-going openings 401 is provided with this reference numeral.

In accordance with the exemplary embodiment in the left-hand part of FIG. 3, the through-going opening 401 is embodied in a cylindrical manner. In accordance with the middle variant in FIG. 3, the through-going opening 401 is embodied with a rectangular cross-section. In accordance with the variant in the right-hand part of FIG. 3, the through-going opening 401 is embodied with a honey-combed-shaped cross-section. Any other shapes of through-going openings are also feasible, such as for example through-going openings with an oval cross-section or through-going openings with any polygon shape as the cross-sectional contour. It is significant that the through-going openings 401 separate the pins 2, wherein in FIG. 3 for reasons of clarity only some of the pins 2 are provided with this reference numeral. By virtue of separating the pins 2, it is ensured that any whiskers growing out of the pins 2 are restricted locally and consequently their undesired electrical influences are minimized.

Figure 4:
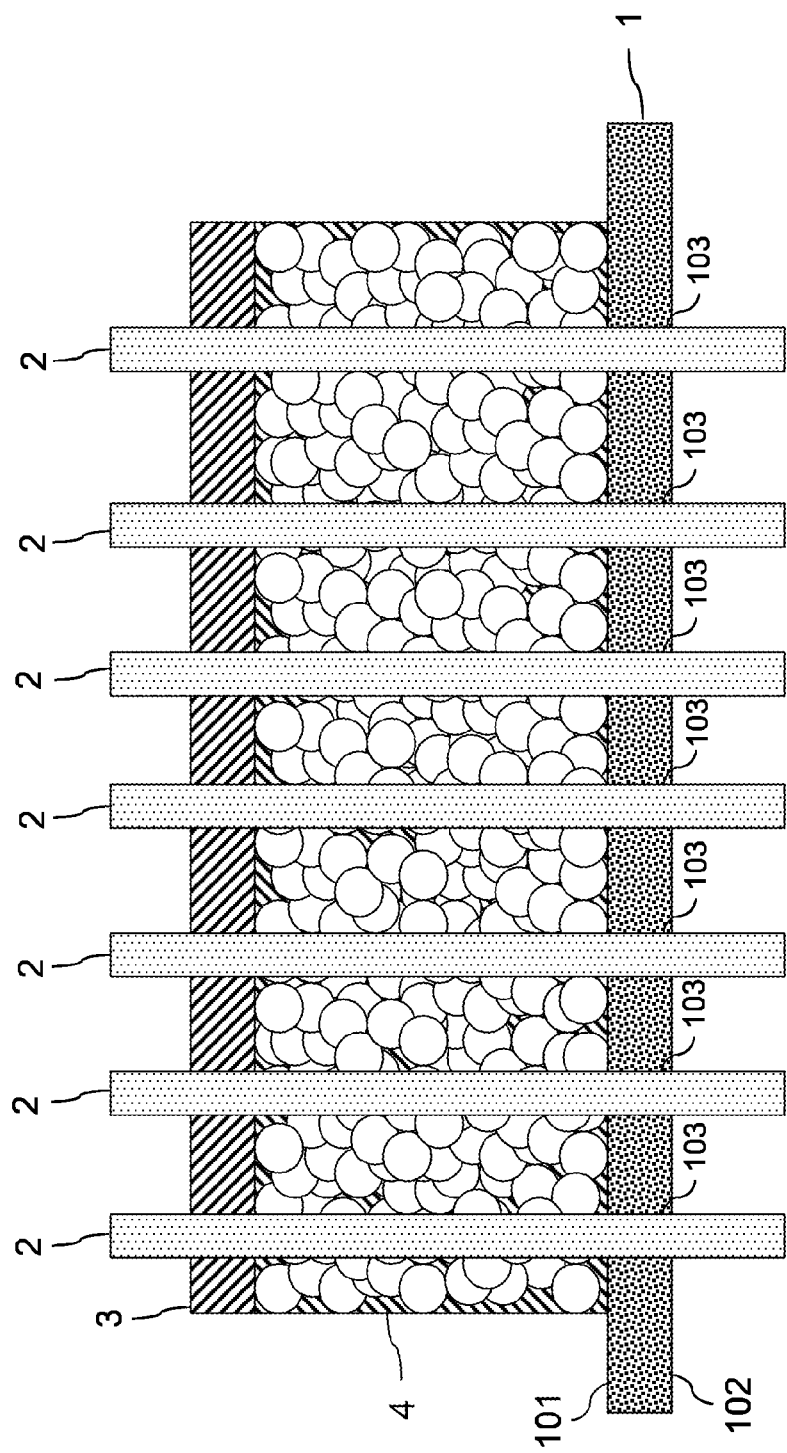
FIG. 4 to FIG. 12 illustrate side views of further embodiments of the arrangement in accordance with the invention.

FIG. 4 illustrates a sectional view of a further exemplary embodiment of an arrangement in accordance with the invention. As in the case of the above mentioned exemplary embodiments, the body 4 is again a prefabricated body, which is arranged between the circuit board 1 and the centering strip 3, adjacent in each case thereto, and through which the pins 2 extend. In contrast to the preceding exemplary embodiments, the prefabricated body 4 is in this case however embodied from a foamed, or in other words a non-conductive material that is provided with pores and which is preferably a foamed synthetic material. In a particularly preferred embodiment, a roller band material is used as a material for the body 4 and said roller band material can be arranged in a particularly simple manner on the circuit board 1.

In one variant, through-going openings 401 are not provided in the body 4 in FIG. 4 prior to positioning the pins 2. On the contrary, the pins 2 are pushed into vias 103 through the foamed synthetic material body during the course of the pressing-in procedure, wherein the pins 2 penetrate the through-going openings 401 through the synthetic material itself. Nonetheless, there is also the possibility that the foamed synthetic body is already provided with through-going openings 401 in advance and the pins 2 are pushed through said through-going openings during the pressing-in procedure. The through-going openings 401 can have a larger diameter than the pins 2.

Figure 5:
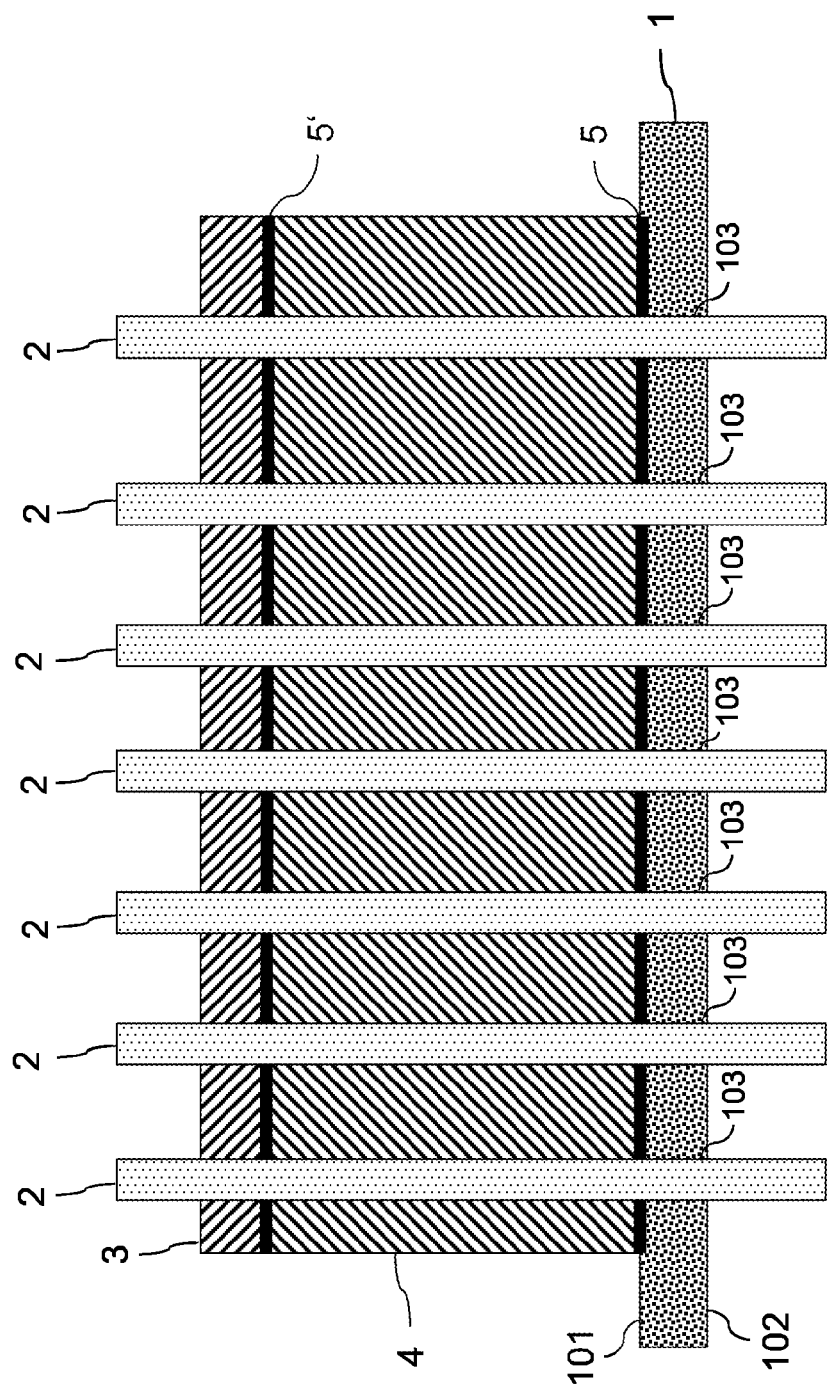

In a further exemplary embodiment of the arrangement illustrated in FIG. 5, the body 4 is connected by means of an adhesive film 5 to the upper face 101 of the circuit board 1. Moreover, the body 4 is connected on its upper face remote from the circuit board 1 by means of a further adhesive film 5' to the lower face of the centering strip 3 that is facing the circuit board 1.

The adhesive film 5 can be applied to the lower face of the body 4 or the upper face 101 of the circuit board 1 prior to joining the circuit board 1 and the body 4. In a similar manner, the adhesive film 5' is applied to the upper face 101 of the body 4 or to the lower face of the centering strip 3 prior to joining the body 4 and the centering strip 3. The adhesive connection between the body 4 and the circuit board 1 or centering strip 3 can be achieved, by way of example, by way of a suitable resin or where appropriate also by way of a suitable method, such as, for example, friction welding. The exemplary embodiment in FIG. 5 differs moreover from the exemplary embodiment in FIG. 1 by virtue of the fact that the through-going openings 401 of the body 4 in which the pins 2 are arranged have a cross-sectional area that corresponds to the cross-sectional area of the sections of pins 2 that are arranged in the through-going openings 401 so that the surfaces of the pins 2 contact the inner face of the through-going openings 401.

In a further embodiment, not illustrated in the figure, the centering strip 3 for guiding the pins 2 is omitted in the case of this exemplary embodiment or in the case of any other embodiment of the arrangement. In this case, the body 4 can be connected directly to the main body of a plug connector in which the contact ends of the pins 2 are located. By way of example, the body 4 is embodied in this case in one piece with the housing of the plug connector.

Figure 6:
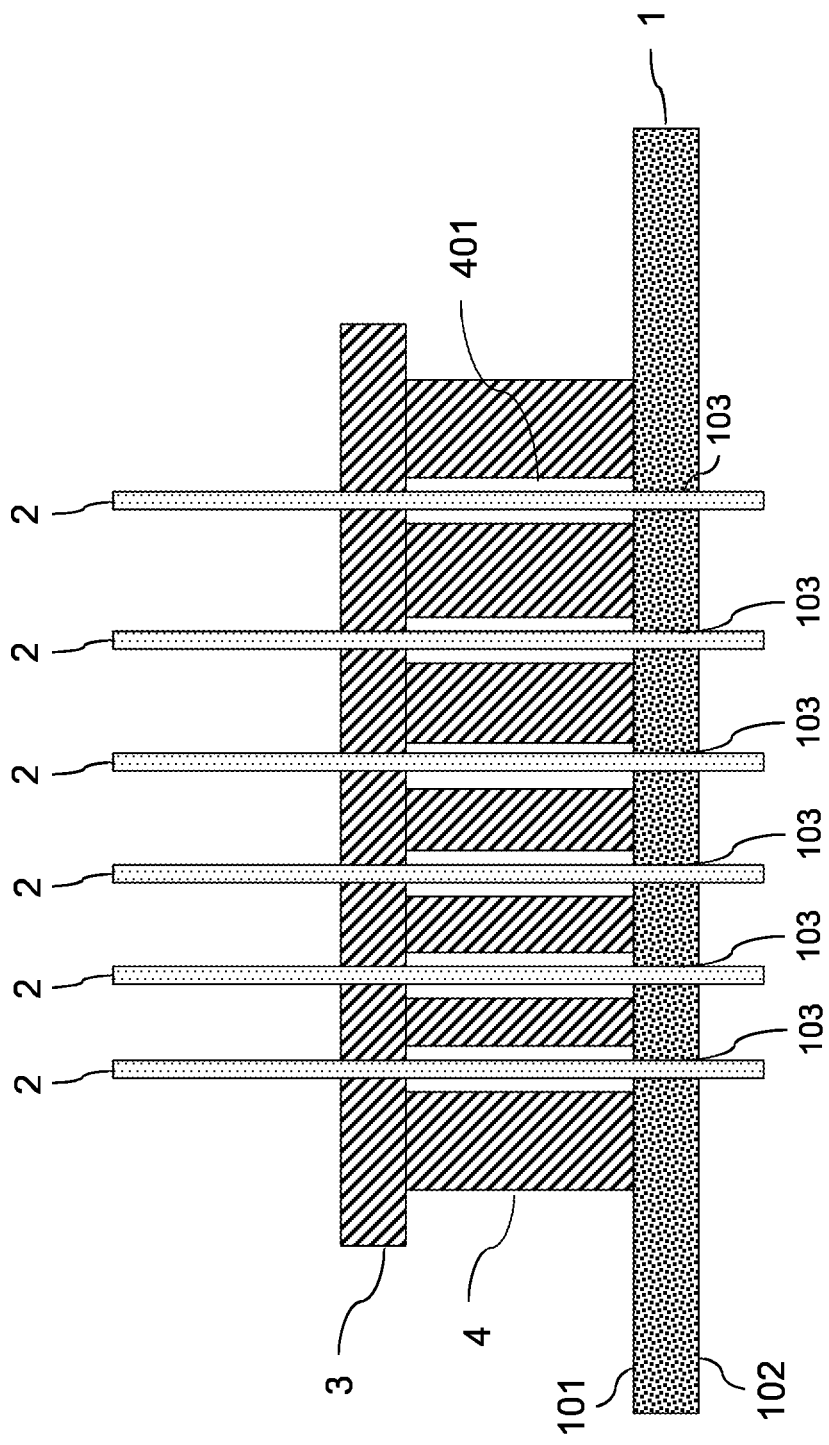

In the exemplary embodiment illustrated in FIG. 6, the centering strip 3 and the body 4 form an integral, in particular one piece, component which is indicated by the identical hash lines of the centering strip and body.

Figure 7:
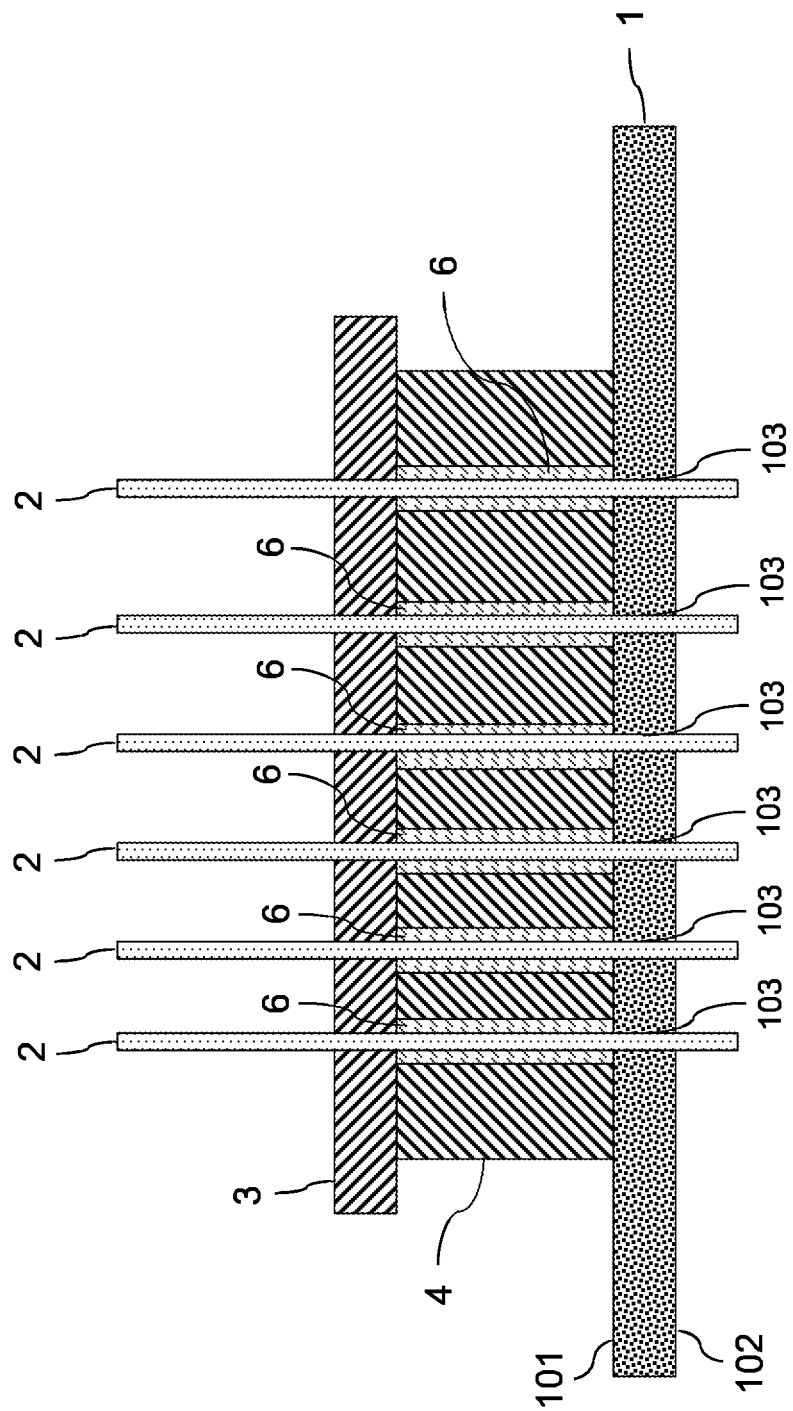

In the further exemplary embodiment in FIG. 7, which otherwise corresponds to the first exemplary embodiment, a filling material of an electrically insulating casting compound 6 is arranged in the free intermediate spaces that are formed between the pins 2 and the inner faces of the through-going openings 401, and said casting compound is a component of the electrically insulating layer 4, 6. The casting compound 6 is introduced into the through-going openings 401 during the procedure of producing the arrangement and said casting compound then hardens. The casting compound thus differs from the prefabricated body 4 that already comprises a fixed structure and shape as it is positioned on the circuit board 1.

In the case of a variant, not illustrated in the figures, of this exemplary embodiment of FIG. 7, multiple pins are arranged in the individual through-going openings 401. The pins are separated in this case by means of the casting compound that is introduced in addition into the body 4.

Figure 8:
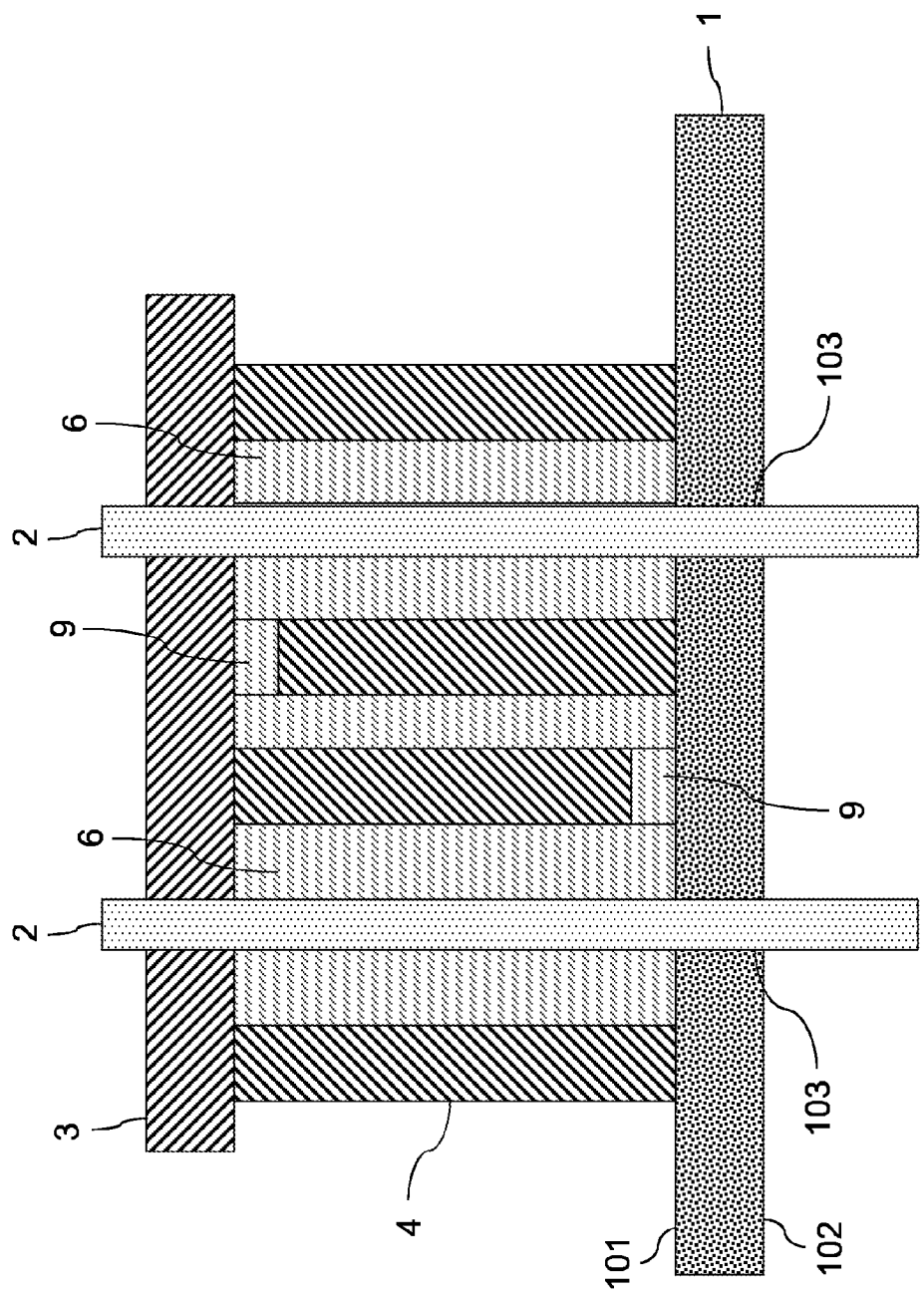

FIG. 8 illustrates in an enlarged view a further exemplary embodiment of an arrangement in accordance with the invention. In a similar manner to the exemplary embodiment in FIG. 7, a casting compound 6 is introduced into the intermediate spaces between the pins 2 and the inner faces of the through-going openings. However, in contrast to the exemplary embodiment in FIG. 7, lateral through passages 9 are provided in the prefabricated body 4 and said through passages are formed in the prefabricated body 4 adjacent to the upper face 101 of the circuit board 1 or adjacent to the lower face of the centering strip 3. When filling the prefabricated body 4 with casting compound, it is possible by means of said through passages 9 to achieve a uniform distribution of the casting compound in all the through-going openings 401 of the body. The lateral through passages 9 that are provided in the body 4 can be arranged at different positions. In particular, said through passages can overlap one another or be distributed in a labyrinth-type manner in the prefabricated body 4.

The body 4 can be fastened to the circuit board 1 in addition or as an alternative to an adhesive connection in a different manner. In particular, the body 4 can be fixed or clamped in the circuit carrier by way of latching lugs or rasping ribs. Said body 4 can also be pushed onto the circuit carrier by means of the centering strip 3.

Figure 9:
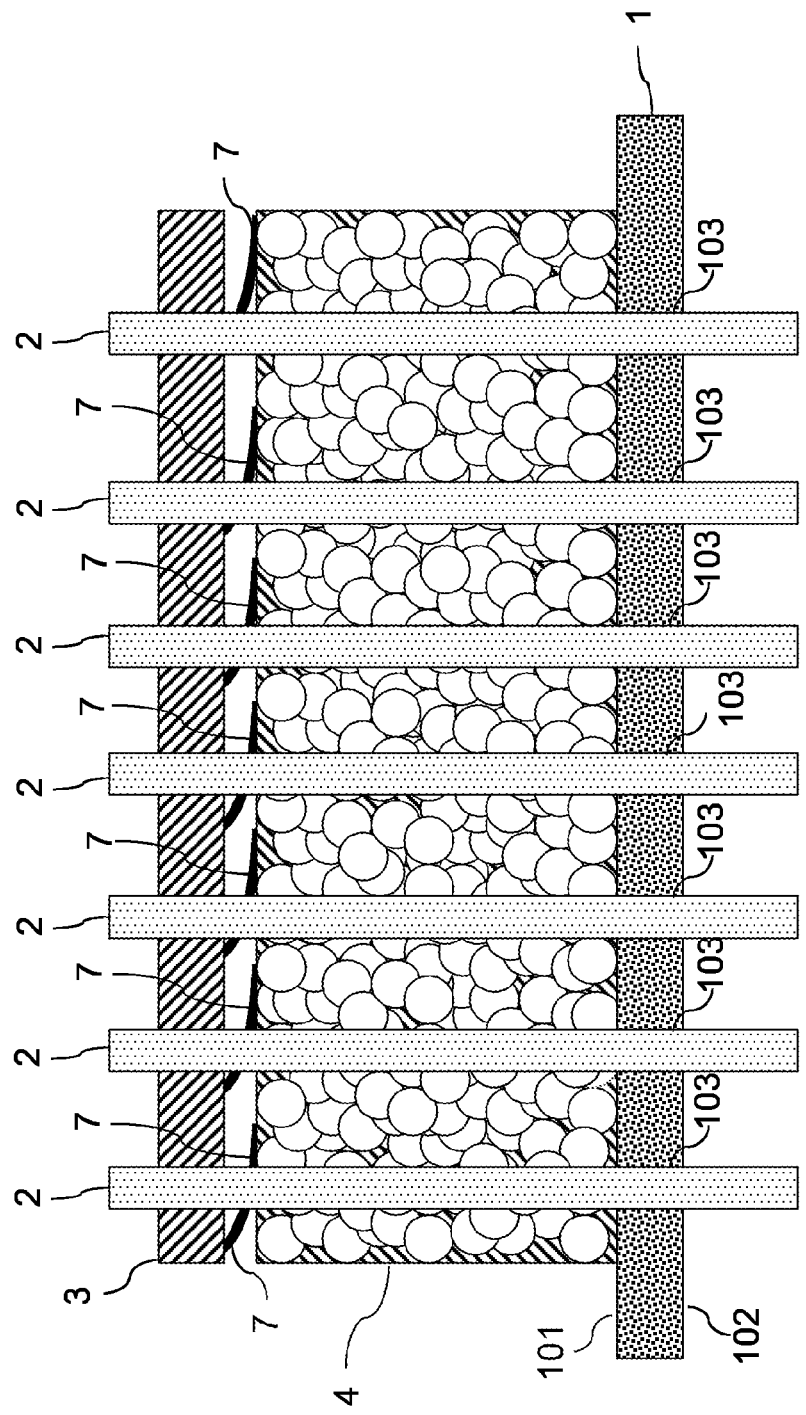

As is illustrated in FIG. 9, there is moreover the possibility that the body 4 is pushed by way of resilient elements 7 onto the upper face 101 of the circuit board 1. The resilient elements are arranged on the lower face of the centering strip 3. Said resilient elements 7 can be formed in advance with the material of the centering strip 3 or can be achieved by way of an additional element.

Figure 10:
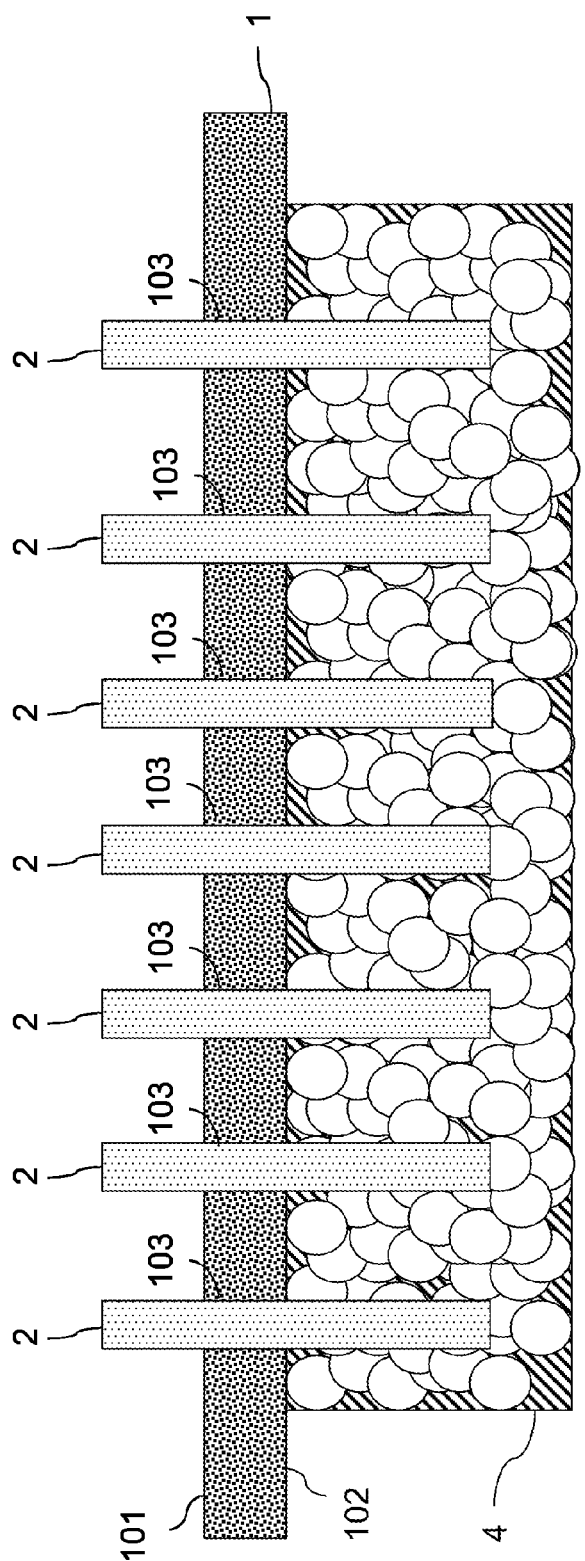

FIG. 10 illustrates a further exemplary embodiment of the arrangement in accordance with the invention. In contrast to the preceding exemplary embodiments, the body 4 that is embodied in turn from a foamed synthetic material is arranged on the lower face 102 of the circuit board 1 and prevents the whisker growth from this lower face. The body 4 is put over the vias 103 after the pins 2 have been soldered or pressed into the circuit board 1. The body 4 surrounds the region of the pins 2 that protrudes downwardly out of the circuit board 1,—in other words away from the lower face 102.

In a further preferred embodiment, a prefabricated body 4 is arranged both on the upper face 101 and also on the lower face 102 of the circuit carrier in order thus to avoid the whisker growth on both sides of the vias (not illustrated in the figures).

Figure 11:
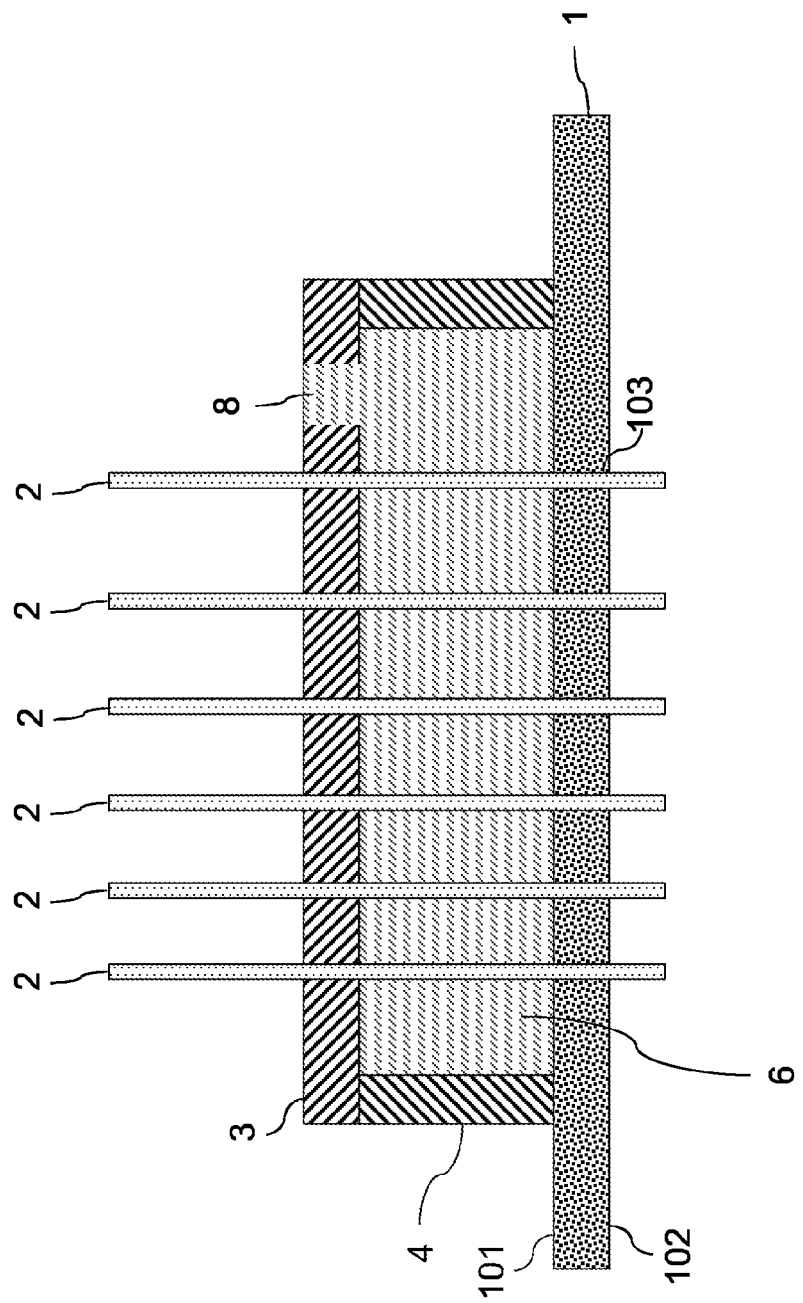

In a further exemplary embodiment that is illustrated in FIG. 11, the body 4 is formed by means of a "lost form". In other words, the body 4 represents merely a border for the pins 2 and the region within the border is in turn filled with the casting compound 6 that is introduced in the exemplary embodiment in FIG. 11 by way of a hole 8 on the upper face of the centering strip 3. In other words, the prefabricated body 4 in the case of the present exemplary embodiment forms a frame that extends laterally around the multiplicity of pins 2 and together with the circuit board 1 forms a tub that is filled with the casting compound 6 in order to separate the pins 2 and suppress the whisker growth.

Figure 12:
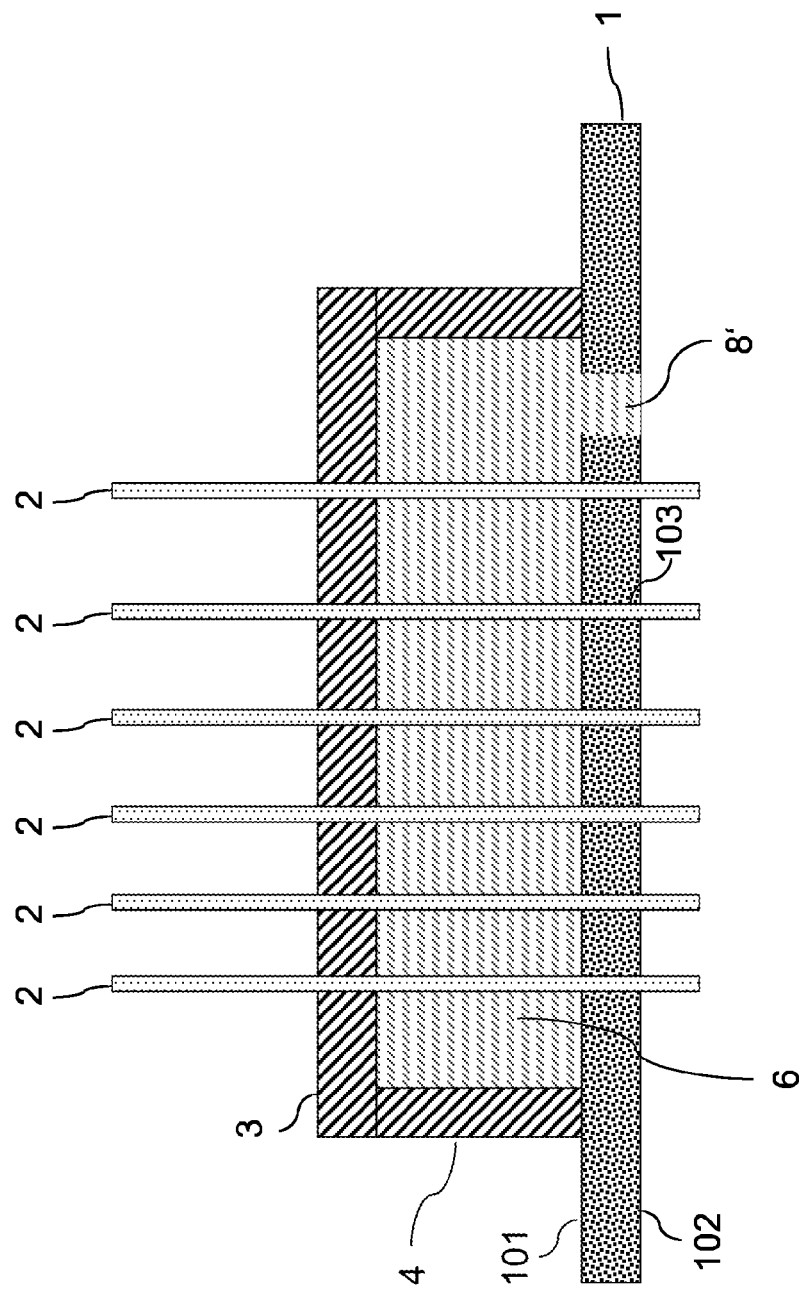

FIG. 12 illustrates a variant of the exemplary embodiment in FIG. 11, wherein the body 4 is filled by way of an opening 8' in the circuit board 1. In this case, the body 4 together with the centering strip 3 forms the tub. Moreover, the centering strip 3 and the body 4 form in turn a one-piece component that is indicated by means of the identical hash lines of these components.

The above described exemplary embodiments of the arrangement provide a series of advantages. In particular, by means of the electrically insulating layer that comprises the prefabricated body 4 and, where appropriate, the casting compound 6, the whisker growth is limited to a local, very narrowly restricted region. This region does not comprise any electrical components. In particular, in the case of bodies 4 that are embodied from a porous material such as the foamed synthetic material and/or with a casting compound 6, the whisker growth can be completely suppressed or at least greatly reduced in a section of the pins 2 that, in the case of conventional arrangements that do not have the electrically insulating layer 4, 6, is particularly susceptible to whisker growth. As a consequence, the risk is particularly small of negative influences of the whisker growth on the electrical function of the circuit board 1, the pins 2, further components or the electronic device in which the circuit carrier is arranged.

The foregoing embodiments have been shown and described for the purposes of illustrating the structural and functional principles of the present invention, as well as illustrating the methods of employing the embodiments and are subject to change without departing from such principles. Therefore, this invention includes all modifications encompassed within the scope of the following claims.

The invention claimed is:

1. An arrangement for a control unit for a motor vehicle, comprising a circuit carrier, the circuit carrier being configured in the form of a plate with a first side and a second side, wherein a plurality of pins are positioned in respective vias of the circuit carrier, the pins being at least one of pressed into the vias and held in the vias by a soldered connection, wherein the pins extend from the first side to a contact end for electrically contacting to one or more components, wherein on at least one of the first side and the second side of the circuit carrier, an electrically insulating layer having a prefabricated body is arranged in a region of the pins, and wherein a section of each pin adjacent to the respective via is arranged on said at least one of the first side and the second side and is laterally continuously enclosed by material of the electrically insulating layer, wherein each of the pins has a coating which contains at least one of tin and zinc, the pins are pressed into the vias, and at least one pin is at least partly uncovered from the coating in at least one of a region of the via and the section of the at least one pin laterally continuously enclosed by the electrically insulating layer, the coating scraped from the at least one pin at the at least one of the region of the via and the section laterally continuously enclosed by the electrically insulating layer.

2. The arrangement according to claim 1, wherein the prefabricated body rests against the circuit carrier.

3. The arrangement according to claim 1, further comprising a centering strip through which the pins are guided, wherein the prefabricated body is arranged between the centering strip and the circuit carrier, the prefabricated body and at least one of the centering strip and the circuit carrier define an inner volume between the centering strip and the circuit carrier through which the pins extend, and the electrically insulating layer further comprises a casting material disposed in the inner volume such that the section of each pin is laterally continuously enclosed by the casting material of the electrically insulating layer.

4. The arrangement according to claim 1, wherein the prefabricated body comprises a porous material of a foamed or elastic plastic material, and that the pins are at least one of pressed through the porous material and arranged in passage openings in the porous material such that for each pin, the section thereof is adjacent to the respective via.

5. The arrangement according to claim 1, wherein the prefabricated body is formed from a solid plastic material.

6. The arrangement according to claim 1, wherein the prefabricated body has a plurality of through-openings, wherein the section of a first pin of the plurality of pins, which is adjacent to a respective via of the plurality of vias, is arranged in a respective through-opening of the plurality of through-openings so that the respective through-opening continuously encloses the section of the first pin, and the section of the first pin is adjacent to the respective through-opening.

7. The arrangement according to claim 1, wherein the prefabricated body has a plurality of through-openings, and at least one pin of the plurality of pins is arranged in at least one through-opening such that the section of the at least one pin is adjacent to the respective via of the plurality of vias and the through-openings are filled with a casting material.

8. The arrangement according to claim 7, wherein the at least one through-opening is connected to at least one other through-opening of the plurality of through-openings by one or more lateral passages at least partly defined in the prefabricated body.

9. The arrangement according to claim 1, further comprising a centering strip in which the pins are guided, wherein the prefabricated body is arranged between the centering strip and the circuit carrier.

10. The arrangement according to claim 9, wherein the centering strip is formed integrally with the prefabricated body.

11. The arrangement according to claim 9, further comprising at least one spring element which presses the prefabricated body against the at least one of the first side and the second side of the circuit carrier.

12. The arrangement as claimed in claim 11, wherein the spring element is arranged between the centering strip and the prefabricated body in order to press the prefabricated body against the circuit carrier.

13. The arrangement according to claim 9, wherein the prefabricated body is attached to at least one of the circuit carrier and the centering strip, the attachment comprising at least one of one or more detent lugs, one or more scraper ribs, and an adhesive.

14. The arrangement according to claim 1, wherein the section of each pin which is laterally enclosed by material of the insulating layer begins at the respective via and extends around a complete circumference of the pin.

15. The arrangement according to claim 1, wherein the section of each pin adjoins the at least one of the first side and the second side of the circuit carrier and extends away from the circuit carrier in a longitudinal direction of the pin, the sections of the pins being separated from one another by side walls formed by the electrically insulating layer.

16. The arrangement according to claim 15, wherein the electrically insulating layer covers 50% or less of the at least one of the first side and the second side of the circuit carrier.

17. The arrangement according to claim 15, wherein the prefabricated body is fixed to the circuit carrier by an adhesive layer or an adhesive film.

18. The arrangement according to claim 15, wherein the prefabricated body has a plurality of through-openings and for each pin of the plurality of pins, the section of the pin is adjacent to the respective via and arranged in a respective through-opening of the plurality of through-openings so that the respective through-opening is adjacent to and continuously encloses the section of the pin.

19. The arrangement according to claim 1, wherein the section of each pin is adjacent the first side of the circuit carrier, extends in a longitudinal direction of the pin away from the circuit carrier and is surrounded by a side wall of the electrically insulating layer, each side wall laterally extends around the section of the corresponding pin such that the section of the pins are separated from one another by the side walls.

20. The arrangement according to claim 1, wherein the section of each pin is adjacent the first side of the circuit carrier and extends in a longitudinal direction of the pin away from the circuit carrier, the electrically insulating layer includes a plurality of side walls, each side wall laterally extends around the section of a corresponding pin such that the section of the pins are separated from one another by the side walls.

21. An arrangement for a control unit for a motor vehicle, comprising a circuit carrier, the circuit carrier being configured in the form of a plate with a first side and a second side, wherein a plurality of pins are positioned in respective vias of the circuit carrier, the pins being at least one of pressed into the vias and held in the vias by a soldered connection, wherein the pins extend from the first side to a contact end for electrically contacting to one or more components, wherein on at least one of the first side and the second side of the circuit carrier, an electrically insulating layer having a prefabricated body is arranged in a region of the pins, and wherein a section of each pin adjacent to the respective via is arranged on said at least one of the first side and the second side and is laterally continuously enclosed by material of the electrically insulating layer, wherein the prefabricated body has a plurality of through-openings, and at least one pin of the plurality of pins is arranged in at least one through-opening such that the section of the at least one pin is adjacent to the respective via of the plurality of vias and the through-openings are filled with a casting material, and wherein the at least one through-opening is connected to at least one other through-opening of the plurality of through-openings by one or more lateral passages at least partly defined in the prefabricated body.

22. An arrangement for a control unit for a motor vehicle, comprising a circuit carrier, the circuit carrier being configured in the form of a plate with a first side and a second side, wherein a plurality of pins are positioned in respective vias of the circuit carrier, the pins being at least one of pressed into the vias and held in the vias by a soldered connection, wherein the pins extend from the first side to a contact end for electrically contacting to one or more components, wherein on at least one of the first side and the second side of the circuit carrier, an electrically insulating layer having a prefabricated body is arranged in a region of the pins, and wherein a section of each pin adjacent to the respective via is arranged on said at least one of the first side and the second side and is laterally continuously enclosed by material of the electrically insulating layer, wherein the arrangement further comprises a centering strip in which the pins are guided, wherein the prefabricated body is arranged between the centering strip and the circuit carrier, and at least one spring element which presses the prefabricated body against the at least one of the first side and the second side of the circuit carrier.

23. The arrangement as claimed in claim 22, wherein the spring element is arranged between the centering strip and the prefabricated body in order to press the prefabricated body against the circuit carrier.

* * * * *